(12) United States Patent
Baba

(10) Patent No.: US 7,208,798 B2
(45) Date of Patent: Apr. 24, 2007

(54) SEMICONDUCTOR DEVICE WITH AN ENHANCEMENT TYPE FIELD EFFECT TRANSISTOR IN WHICH THRESHOLD VOLTAGE IS DEPENDENT UPON SUBSTRATE BIAS VOLTAGE

(75) Inventor: Shunsuke Baba, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 174 days.

(21) Appl. No.: 10/747,149

(22) Filed: Dec. 30, 2003

(65) Prior Publication Data

US 2005/0006702 A1 Jan. 13, 2005

(30) Foreign Application Priority Data

Jul. 7, 2003 (JP) .............................. 2003-193023

(51) Int. Cl.
*H01L 21/331* (2006.01)
(52) U.S. Cl. ..................................................... 257/347
(58) Field of Classification Search ................ 257/206, 257/347, 349, 368, 393
See application file for complete search history.

(56) References Cited

U.S. PATENT DOCUMENTS

| | | | |
|---|---|---|---|
| 6,043,536 A | 3/2000 | Numata et al. | |
| 6,410,966 B2 * | 6/2002 | Takahashi et al. | 257/368 |

FOREIGN PATENT DOCUMENTS

| | | |
|---|---|---|
| JP | 63-055975 | 3/1988 |
| JP | 63-156352 | 6/1988 |
| JP | 05-268027 | 10/1993 |
| JP | 06-013606 | 1/1994 |
| JP | 2001-274382 | 10/2001 |

* cited by examiner

*Primary Examiner*—Howard Weiss
*Assistant Examiner*—(Vikki) Hoa B. Trinh
(74) *Attorney, Agent, or Firm*—Rabin & Berdo, P.C.

(57) ABSTRACT

An enhancement mode field effect transistor whose operation threshold value varies greatly according to the substrate voltage. This field effect transistor is implemented by substituting the gate electrode of a depression mode field effect transistor for a gate electrode of the conductivity type opposite to that of a channel formation region, or a midgap gate electrode. In a preferred embodiment of the present invention, this field effect transistor is provided between a CMOS structure logic gate and a ground line. As a result, the leak current when the field effect transistor is not operating can be diminished without reducing the operational speed of the logic gate.

18 Claims, 6 Drawing Sheets

Prior Art

SEMICONDUCTOR DEVICE WITH AN ENHANCEMENT TYPE FIELD EFFECT TRANSISTOR IN WHICH THRESHOLD VOLTAGE IS DEPENDENT UPON SUBSTRATE BIAS VOLTAGE

BACKGROUND OF THE INVENTION

1. Field of the Invention

The present invention relates to a semiconductor integrated circuit, a semiconductor device, and a semiconductor device fabrication method and, more particularly, to technology for reducing the leak current of the semiconductor integrated circuit.

2. Description of Related Art

In recent years, the demand for increased intricacy in semiconductor integrated circuits has grown steadily. A reduction in the voltages of power sources has accompanied this increase in the intricacy of semiconductor integrated circuits. In order to lower the supply voltage, the threshold value voltage of the transistor constituting the semiconductor integrated circuit must be set low. For example, when the supply voltage is 1 volt, the threshold value voltage of a field effect transistor is desirably on the order of 0.2 to 0.3 volt. However, the lower the threshold value voltage, the greater the leak current when the field effect transistor is turned OFF. For this reason, when the threshold value voltage is lowered, the power consumption when the semiconductor integrated circuit is not operating increases.

Figure 6:
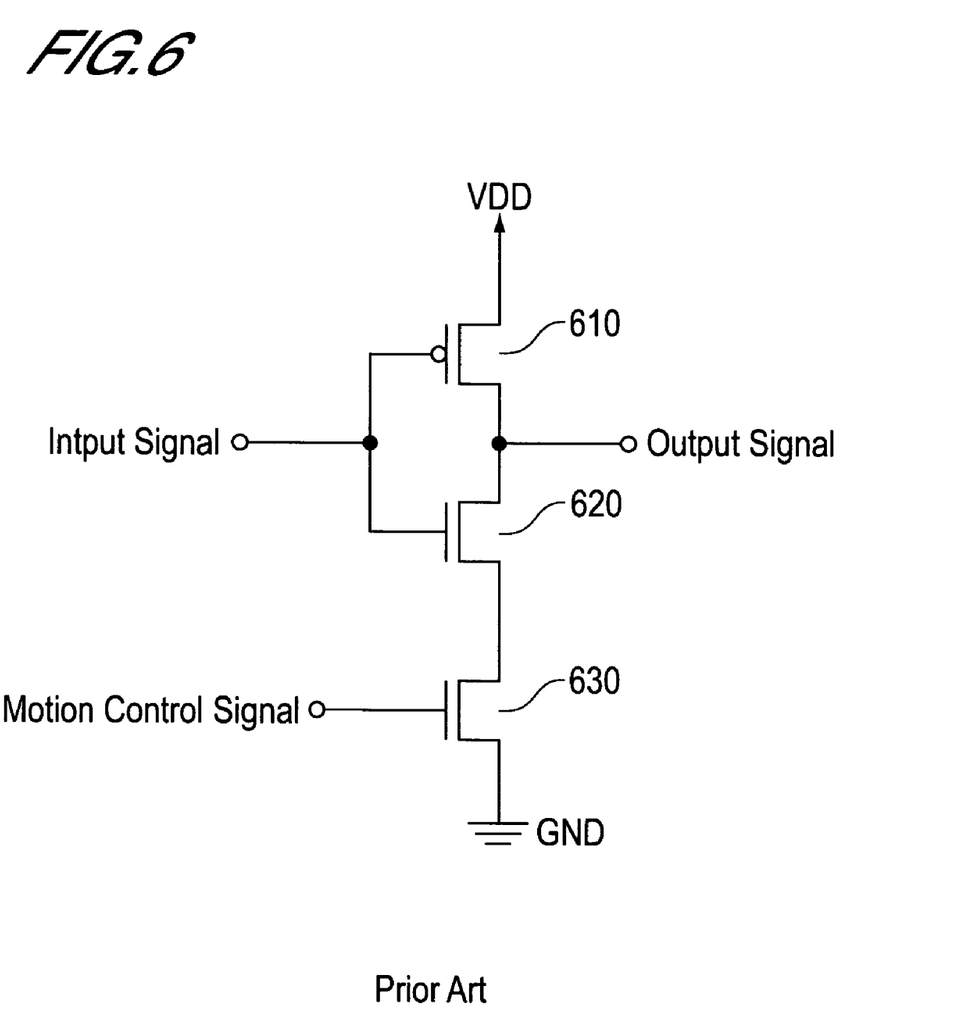
FIG. 6 is a circuit diagram that shows an example of the constitution of a conventional semiconductor integrated circuit.

Circuits such as the one shown in FIG. 6, for example, are known as semiconductor integrated circuits that resolve these drawbacks. In the circuit in FIG. 6, a pMOS transistor 610 and an nMOS transistor 620 constitute an inverter. Further, an nMOS transistor 630 used to prevent a leak current is provided between the nMOS transistor 620 and the ground line. An operation control signal is input to the gate of the nMOS transistor 630. In accordance with this operation control signal, the nMOS transistor 630 is always ON when the semiconductor integrated circuit is in an operational state, and always OFF when same is not operating. An enhancement mode MOS transistor with a low threshold value voltage is used as the pMOS transistor 610 and the nMOS transistor 620. On the other hand, the nMOS transistor 630 is a high threshold value enhancement mode MOS transistor, and hence the leak current in an OFF state is extremely small. Thus, because the nMOS transistor 630 is used, the power consumption when the semiconductor integrated circuit is not operating is reduced.

As a technology for reducing the leak current, the semiconductor integrated circuit appearing in the Japanese Patent Application Laid Open No. 05-268027 below, for example, is also known. With this circuit, a reduction of the leak current is achieved by raising the back gate bias of the nMOS transistor when the current penetrating same has increased.

In addition, technologies for forming semiconductor devices by using an SOI (Silicon On Insulator) substrate are known from the prior art. By using an SOI substrate, it is easy to increase the intricacy and speed of the semiconductor integrated circuit. Known semiconductor devices which employ an SOI substrate are those appearing in Japanese Patent Application Laid Open No. 06-013606 and U.S. Pat. No. 6,043,536, for example.

In the semiconductor integrated circuit shown in FIG. 6, an operation control signal is input from the outside, and hence a signal terminal fulfilling this purpose is required. Consequently, there is the drawback that the surface area of the wiring layer increases.

Further, in the case of this semiconductor integrated circuit, the threshold value voltage of the nMOS transistor 630 is raised by increasing the impurity concentration of the SOI layer. Hence, there is the drawback that the withstand voltage of the nMOS transistor 630 then drops due to the parasitic bipolar effect.

On the other hand, the semiconductor integrated circuit disclosed in Japanese Patent Application Laid Open No. 05-268027 must be a circuit for controlling the back gate bias by detecting an increase in the penetration current, and there is therefore the drawback that the circuit scale is then extremely large.

SUMMARY OF THE INVENTION

An object of the present invention is to provide a semiconductor integrated circuit with a small circuit scale that has a small leak current when the circuit is not operating.

(1) A semiconductor integrated circuit according to a first invention comprises: a first field effect transistor with a first conductivity type enhancement structure that comprises a first conductivity type gate electrode; a second field effect transistor with a second conductivity type enhancement structure that comprises a second conductivity type gate electrode; a third field effect transistor that has a structure produced by substituting the gate electrode of a field effect transistor having a second conductivity type depression structure for a midgap gate electrode or a first conductivity type gate electrode; first wiring that connects a first main electrode of the first field effect transistor and a first main electrode of the second field effect transistor to an output node; second wiring that connects the gate electrode of the first, second and third field effect transistors to an input node; third wiring that connects a second main electrode of the second field effect transistor and a first main electrode of the third field effect transistor; a first power supply line that supplies a first supply voltage to a second main electrode of the first field effect transistor; a second power supply line that supplies a second supply voltage to a second main electrode of the third field effect transistor; and a third power supply line that supplies a substrate voltage to the second and third field effect transistors.

According to the semiconductor integrated circuit relating to the first invention, the threshold value voltage of the third field effect transistor can be controlled by controlling the substrate voltage, and hence the leak current when this circuit is not operating can be reduced.

(2) A semiconductor device relating to a second invention comprises: a first field effect transistor in which first and second high concentration impurity regions of a first conductivity type are formed such that a second conductivity type channel formation region is interposed therebetween, a first conductivity type gate electrode is formed on the channel formation region via a gate insulation film, and the threshold value voltage is a positive voltage; a second field effect transistor in which first and second high concentration impurity regions of a second conductivity type are formed such that a first conductivity type channel formation region is interposed therebetween, a second conductivity type gate electrode is formed on the channel formation region via a gate insulation film, and the threshold value voltage is a positive voltage; a third field effect transistor in which first and second high concentration impurity regions of a second conductivity type are formed such that a first conductivity type channel formation region is interposed therebetween, a gate electrode is formed on the channel formation region via a gate insulation film, the impurity concentration of the channel formation region is set lower than the impurity concentration of the channel formation region provided in the second field effect transistor, and the energy gap of the gate electrode is set at a value at which the threshold value voltage is a positive voltage; first wiring that connects a first main electrode of the first field effect transistor and a first main electrode of the second field effect transistor to an output node; second wiring that connects the gate electrode of the first, second and third field effect transistors to an input node; third wiring that connects a second main electrode of the second field effect transistor and a first main electrode of the third field effect transistor; a first power supply line that supplies a first supply voltage to a second main electrode of the first field effect transistor; a second power supply line that supplies a second supply voltage to a second main electrode of the third field effect transistor; and a third power supply line that supplies a substrate voltage to the second and third field effect transistors.

According to the semiconductor integrated circuit relating to the second invention, the threshold value voltage of the third field effect transistor can be controlled by controlling the substrate voltage, and hence the leak current when the circuit is not operating can be diminished.

(3) A semiconductor device relating to a third invention has a field effect transistors that comprises: a first conductivity type semiconductor layer with a depression structure that comprises a channel formation region, and first and second high concentration impurity regions formed with the channel formation region interposed therebetween; and a midgap gate electrode or first conductivity type gate electrode that is formed on the surface of the channel formation region via a gate insulation film.

According to the third invention, a field effect transistor whose threshold value voltage can be controlled by controlling the substrate voltage can be provided.

(4) A semiconductor device relating to a fourth invention has a integrated field effect transistor that comprises: a first channel formation region of a first conductivity type that has the impurity concentration of a depression structure; a second channel formation region of a first conductivity type that adjoins the first channel formation region and has the impurity concentration of an enhancement structure; first and second high concentration impurity regions of a first conductivity type that are formed with the first and second channel formation regions interposed therebetween; a midgap gate electrode or second conductivity type gate electrode formed on the surface of the first channel formation region via a gate insulation film; and a first conductivity type gate electrode that is formed on the surface of the second channel formation region via the gate insulation film.

According to the fourth invention, an ordinary enhancement mode field effect transistor, and a field effect transistor whose threshold value voltage can be controlled by controlling the substrate voltage can be formed integrally.

(5) A semiconductor device fabrication method relating to a fifth invention comprises: a first step of forming a semiconductor layer having a depression structure impurity concentration on a semiconductor substrate; a second step of forming a midgap gate electrode or a first gate electrode of a first conductivity type on the semiconductor layer via a first insulation film; a third step of forming a first impurity region that has an enhancement structure impurity concentration by selectively doping an impurity to the semiconductor layer via a surface region adjoining the first gate electrode; a fourth step of forming a second gate electrode of a second conductivity type to establish a connection to the semiconductor layer and the first gate electrode via a second insulation film; and a fifth step of forming, on both sides of the first and second gate electrodes, second and third impurity regions of a concentration that is higher than that of the first impurity region by doping an impurity to the semiconductor layer through self alignment in which the first and second gate electrodes are employed.

According to the fifth invention, the semiconductor device relating to the fourth invention can be fabricated by means of a simple process.

BRIEF DESCRIPTION OF THE DRAWINGS

Further objects and advantages of the present invention will be described with reference to the following attached drawings.

DESCRIPTION OF THE PREFERRED EMBODIMENTS

Embodiments of the present invention will be described below with reference to the drawings. In the drawings, the size, shape, and dispositional relationship of each component are merely shown schematically to permit an understanding of the present invention and the numerical conditions described below are only used as an illustration.

First Embodiment

First of all, the first embodiment of the present invention will be described by using FIGS. 1 to 3.

Figure 1:
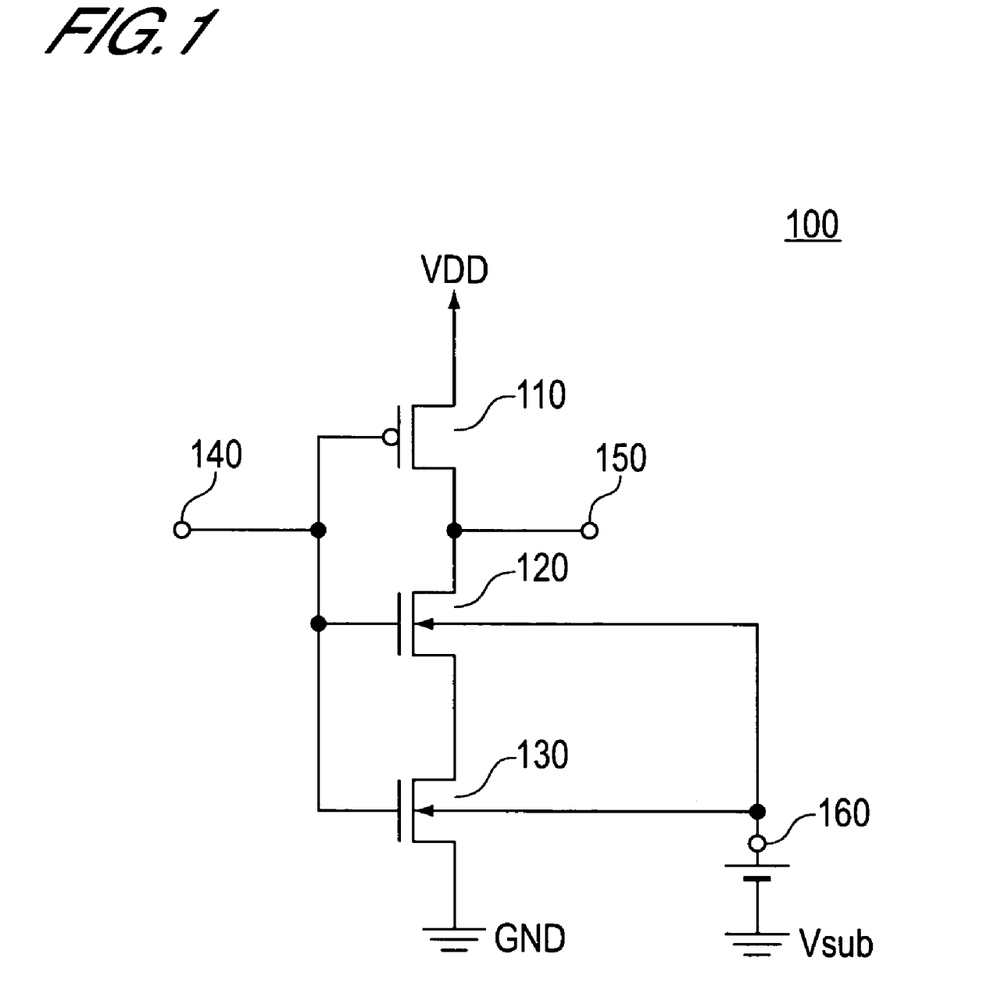
FIG. 1 is a circuit diagram showing the constitution of a semiconductor integrated circuit relating to a first embodiment.

FIG. 1 is a circuit diagram that shows an example in which the present embodiment is applied to an inverter with a CMOS (Complementary Metal Oxide Semiconductor) structure.

As shown in FIG. 1, this inverter 100 comprises a pMOS transistor 110, an nMOS transistor 120, and a leak-current prevention nMOS transistor 130.

The pMOS transistor 110 is connected such that the source thereof is connected to a power supply line VDD, the drain is connected to a signal output terminal 150, and the gate is connected to a signal input terminal 140. In this embodiment, an enhancement mode pMOS transistor having a p$^+$ polysilicon gate is used as the pMOS transistor 110.

The nMOS transistor 120 is connected such that the drain thereof is connected to the signal output terminal 150, and the gate is connected to the signal input terminal 140. Further, a substrate voltage Vsub is applied to the nMOS transistor 120 from the outside via a substrate voltage terminal 160. In this embodiment, an enhancement mode nMOS transistor having an n+ polysilicon gate is used as the nMOS transistor 120.

The nMOS transistor 130 is connected such that the drain thereof is connected to the source of the nMOS transistor 120, the source is connected to a ground line GND, and the gate is connected to the signal input terminal 140. The substrate voltage Vsub is also applied to the nMOS transistor 130 from the outside via the substrate voltage terminal 160. As will be described subsequently, in this embodiment, a transistor produced by substituting the gate of a depression mode nMOS transistor for a midgap gate is used as the nMOS transistor 130.

In this embodiment, both the potential VDD of the power supply line and the substrate voltage Vsub are one volt.

Figure 2:
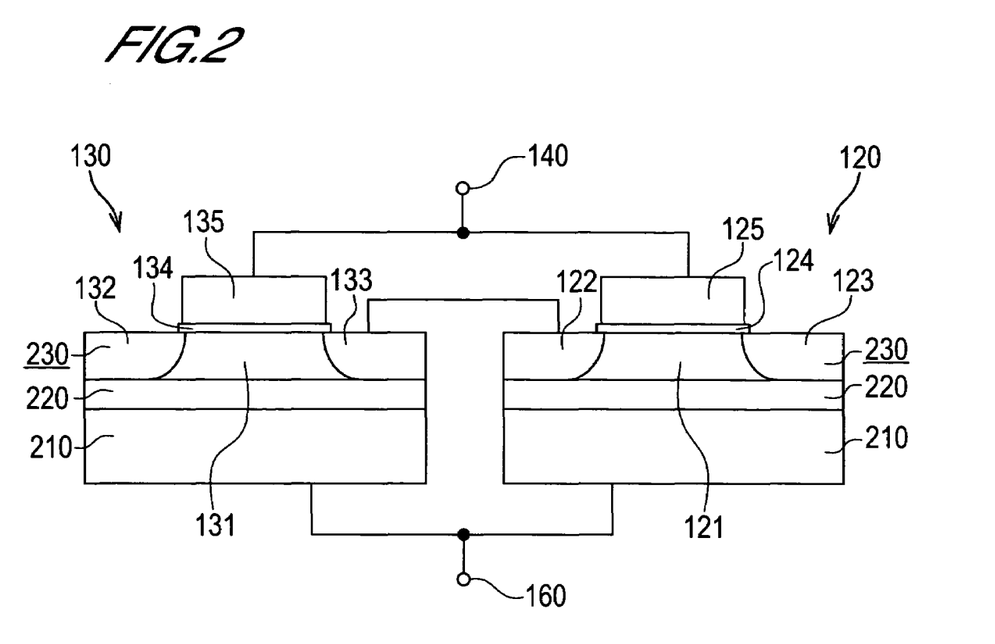
FIG. 2 is a cross-sectional view that conceptually shows the element structure of the field effect transistor shown in FIG. 1.

FIG. 2 is a cross-sectional view that conceptually shows the element structure of the nMOS transistors 120 and 130.

As shown in FIG. 2, a p-type semiconductor layer 230 is provided on a substrate 210 via an insulation film 220. An SOI substrate is therefore used in this embodiment.

In the region where the nMOS transistor 120 is formed, the impurity concentration of the p-type semiconductor layer 230 is set at a high concentration ($5 \times 10^{17}$ cm$^{-3}$ in this embodiment). Therefore, a channel formation region 121 is a p-type impurity region. By doping an n-type impurity to the p-type semiconductor layer 230, an n-type source region 122 and an n-type drain region 123 are formed. A gate electrode 125 is formed on the surface of the channel formation region 121 via a gate oxide film 124. As mentioned above, the gate electrode 125 of the nMOS transistor 120 is formed from n+ polysilicon.

In the region where the nMOS transistor 130 is formed, the impurity concentration of the p-type semiconductor layer 230 is set at a low concentration ($1 \times 10^{15}$ cm$^{-3}$ in this embodiment). Therefore, a channel formation region 131 is a p-type intrinsic semiconductor region. As will be described subsequently, a depression mode transistor structure can be formed by forming the channel formation region 131 by means of a p-type intrinsic semiconductor. An n-type source region 132 and an n-type drain region 133 are formed by doping an n-type impurity to the p-type semiconductor layer 230. A gate electrode 135 is formed on the surface of the channel formation region 131 via a gate oxide film 134. In this embodiment, a midgap gate electrode is adopted as the gate electrode 135 of the nMOS transistor 130.

Here, the midgap gate electrode is a gate that has an energy gap at a midway point between an n+ polysilicon gate and a p+ polysilicon gate. The midgap gate can be formed by TaSi$_2$, TiSi$_2$, TaSi, WSi$_2$, MoSi$_2$, or the like, for example.

Figure 3:
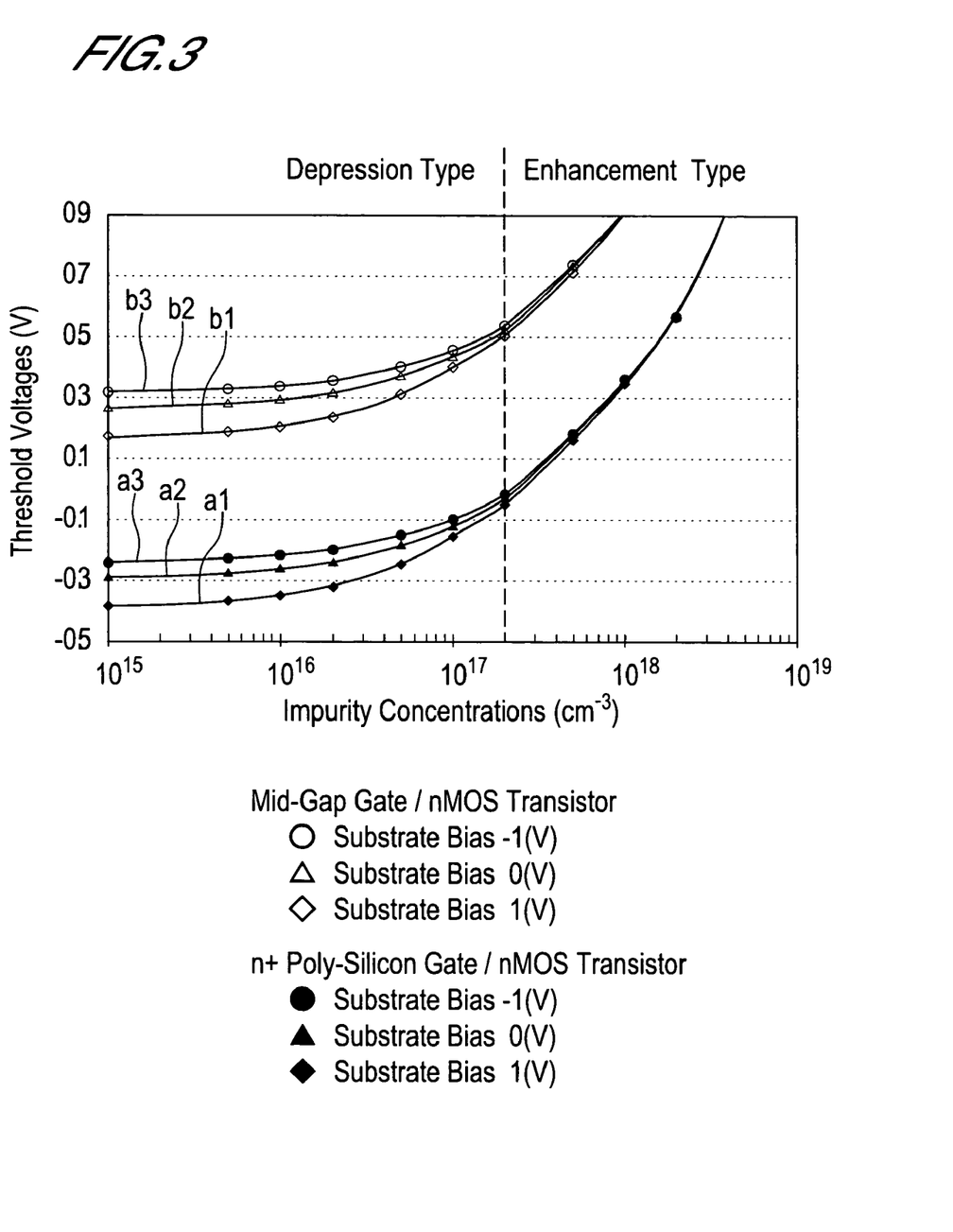
FIG. 3 is a graph that serves to illustrate the characteristics of the field effect transistor shown in FIG. 1.

FIG. 3 is a graph that shows an example of the relationship between the impurity concentration of the p-type channel formation region and the threshold value voltage in an nMOS transistor. In FIG. 3, the impurity concentration (cm$^{-3}$) of the p-type channel formation region is plotted on the horizontal axis, while the threshold value voltage (V) is plotted on the vertical axis. Further, in FIG. 3, the curved line a1 represents a case where the gate is an n+ polysilicon gate and the substrate voltage Vsub is 1 volt; the curved line a2 represents a case where the gate is an n+ polysilicon gate and the substrate voltage Vsub is 0 volt; the curved line a3 represents a case where the gate is an n+ polysilicon gate and the substrate voltage Vsub is −1 volt; the curved line b1 represents a case where the gate is a midgap gate and the substrate voltage Vsub is 1 volt; the curved line b2 represents a case where the gate is a midgap gate and the substrate voltage Vsub is 0 volt; and the curved line b3 represents a case where the gate is a midgap gate and the substrate voltage Vsub is −1 volt.

As can be seen from curved lines a1 to a3, with an nMOS transistor for which an n+ polysilicon gate is adopted, the threshold value voltage is a positive value when the impurity concentration of the channel formation region is approximately $2 \times 10^{17}$ or more, and the threshold value voltage assumes a negative value when the impurity concentration of the channel formation region is approximately $2 \times 10^{17}$ or less. That is, an n+ polysilicon gate nMOS transistor is an enhancement mode nMOS transistor when the impurity concentration is approximately $2 \times 10^{17}$ or more, and a depression mode nMOS transistor when this impurity concentration is approximately $2 \times 10^{17}$ or less. In the case of the present invention, "enhancement mode" and "enhancement structure" refer to a transistor structure with which the threshold value voltage is a positive value when it is assumed that a polysilicon gate is adopted. On the other hand, "depression mode" and "depression structure" denote a transistor structure with which the threshold value voltage is a negative value when it is assumed that a polysilicon gate is adopted.

In addition, as can be seen from the curved lines b1 to b3, the threshold value voltage can be shifted in a positive direction by substituting the gate of the nMOS transistor for a midgap gate electrode. This is because the energy gap of the midgap gate electrode is larger than that of n+ polysilicon. Thus, a depression mode nMOS transistor having a midgap gate electrode allows the threshold value voltage to be set at a value between 0 volt and 1 volt.

As mentioned above, the nMOS transistor 120 (that is, an enhancement mode nMOS transistor employing an n+ polysilicon gate) is such that the impurity concentration of the channel formation region 121 is set at $5 \times 10^{17}$ cm$^{-3}$. On the other hand, in the case of the nMOS transistor 130 (that is, a depression mode nMOS transistor employing a midgap gate), the impurity concentration of the channel formation region 131 is set at $1 \times 10^5$ cm$^{-3}$. As a result, the respective threshold value voltages of the nMOS transistors 120 and 130 when the substrate voltage is 1 volt can be substantially matched. In the example of FIG. 3, when the substrate voltage is 1 volt, the threshold value voltage of the nMOS transistor 120 is 0.169 volt, whereas the threshold value voltage of the nMOS transistor 130 is 0.17 volt.

In addition, when the substrate voltage is 0 volt, the threshold value voltage of the nMOS transistor 120 is 0.18 volt, whereas the threshold value voltage of the nMOS transistor 130 is 0.27 volt. Therefore, whereas the threshold value voltage is barely dependent on the substrate voltage in the case of the enhancement mode MOS transistor, the threshold value voltage is greatly dependent on the substrate voltage in the case of a depression mode MOS transistor. Therefore, by adopting a depression mode transistor as the nMOS transistor 130, the drain current when the substrate voltage is 1 volt can be adequately increased and the leak current when the substrate voltage is 0 volt can be adequately reduced (described subsequently).

The operation of the inverter 100 according to this embodiment is described below.

When the semiconductor integrated circuit is in an operative state, the substrate voltage Vsub is set at 1 volt. For this reason, the threshold value voltage of the nMOS transistors 120 and 130 are substantially the same (approximately 0.17 volt).

When the signal voltage of the signal input terminal 140 is at the high level (1 volt), the nMOS transistors 120 and 130 are turned ON at substantially the same time. At this time, the threshold value voltage of the nMOS transistor 130 is of the same magnitude as the threshold value voltage of the nMOS transistor 120, and hence the current flowing from the signal output terminal 150 to the ground line GND (that is, the drain current of the nMOS transistors 120 and 130) is then sufficiently large. Therefore, the operational speed of the inverter 100 is adequately high.

When the signal voltage of the signal input terminal 140 is at the low level (zero volt), the nMOS transistors 120 and 130 are turned OFF at substantially the same time. Here, the threshold value voltage of the nMOS transistor 130 is of the same magnitude as the threshold value voltage of the nMOS transistor 120 and hence the current flowing from the signal output terminal 150 to the ground line GND (that is, the leak current of the nMOS transistors 120 and 130) is of the same magnitude as in a case where the nMOS transistor 130 is not provided.

On the other hand, when the semiconductor integrated circuit is not operating, the substrate voltage Vsub is set at 0 volt. At such time, the threshold value voltage of the nMOS transistor 120 barely changes, but the threshold value voltage of the nMOS transistor 130 rises to approximately 0.27 volt (as mentioned earlier). For this reason, the leak current flowing to the ground line GND via the nMOS transistors 120 and 130 is then extremely small. In this embodiment, the leak current when the circuit is not operating is on the order of $1 \times 10^{-13}$ amperes.

As described above, according to this embodiment, because the depression mode nMOS transistor 130 with a midgap gate is provided, the leak current when the circuit is not operating can be suppressed without compromising the high speed operation. Therefore, the power consumption of the semiconductor integrated circuit can be reduced.

Further, according to this embodiment, because operation/non-operation switching control is carried out in dependence on the substrate voltage Vsub, a switching-control dedicated signal terminal is unnecessary. For this reason, the surface area of the wiring layer does not increase.

In addition, according to this embodiment, the channel formation region of the leak-current prevention nMOS transistor 130 is set at a low impurity concentration (see FIG. 3). Therefore, there is no risk of a withstand voltage drop caused by the parasitic bipolar effect.

Further, although a midgap gate is adopted as the gate electrode of the depression mode nMOS transistor 130 in this embodiment, a $p^+$ polysilicon gate can also be adopted. When a $p^+$ polysilicon gate is adopted, the curved line representing the threshold value voltage of the nMOS transistor 130 shifts further in a positive direction than when a midgap gate is adopted (see FIG. 3). For example, the operation threshold value when the impurity concentration of the channel formation region is $1 \times 10^{15}$ cm$^{-3}$ and the substrate voltage is 1 volt is on the order of 0.8 volt when a $p^+$ polysilicon gate is adopted. Generally, the threshold value voltage is desirably set at about ¼ to ⅓ of the supply voltage. Therefore, in the case of a semiconductor integrated circuit in which the supply voltage VDD is about 2.4 to 3.2 volt, for example, by adopting a $p^+$ polysilicon gate, the threshold value voltage can be set at an appropriate value and the power consumption when the circuit is not operating can be reduced.

Although a case where the nMOS transistor of the present invention is connected to an inverter is taken as an example in the first embodiment, the effects of the present invention can also be obtained when same is employed in other integrated circuits, such as in another type of CMOS logic gate, for example.

Second Embodiment

Next, the second embodiment of the present invention will be described by using FIGS. 4 and 5.

This embodiment is an example in which an enhancement mode nMOS transistor employing an $n^+$ polysilicon gate (equivalent to the nMOS transistor 120 of FIGS. 1 and 2) and a depression mode nMOS transistor (equivalent to the nMOS transistor 130 in FIGS. 1 and 2) employing a midgap gate are integrally formed.

Figure 4:
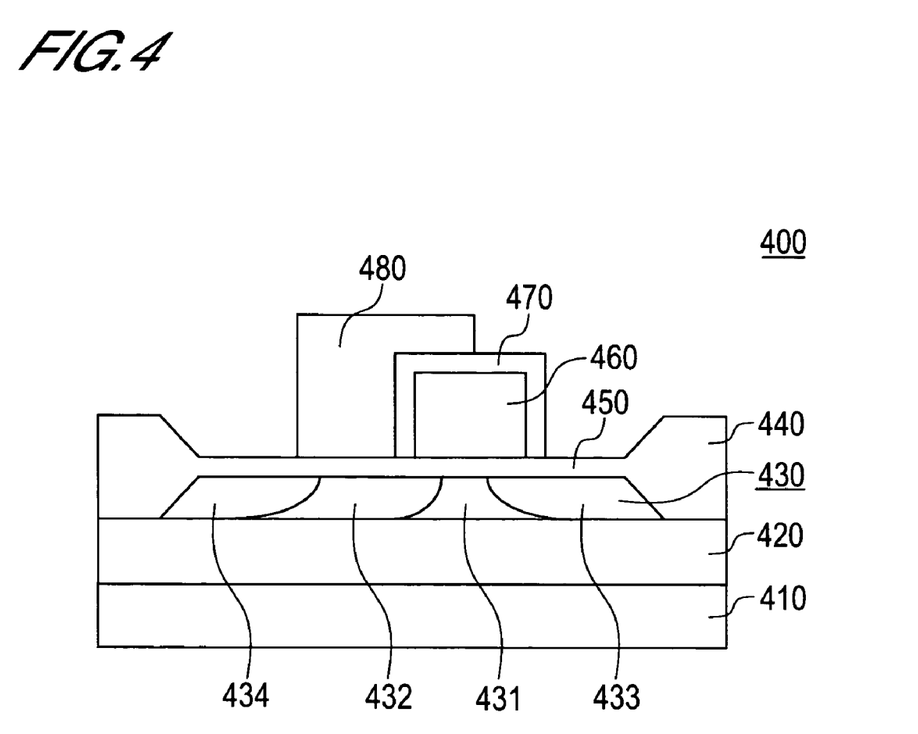
FIG. 4 is a cross-sectional view that conceptually shows the element structure of a field effect transistor relating to a second embodiment.
Figure 5:
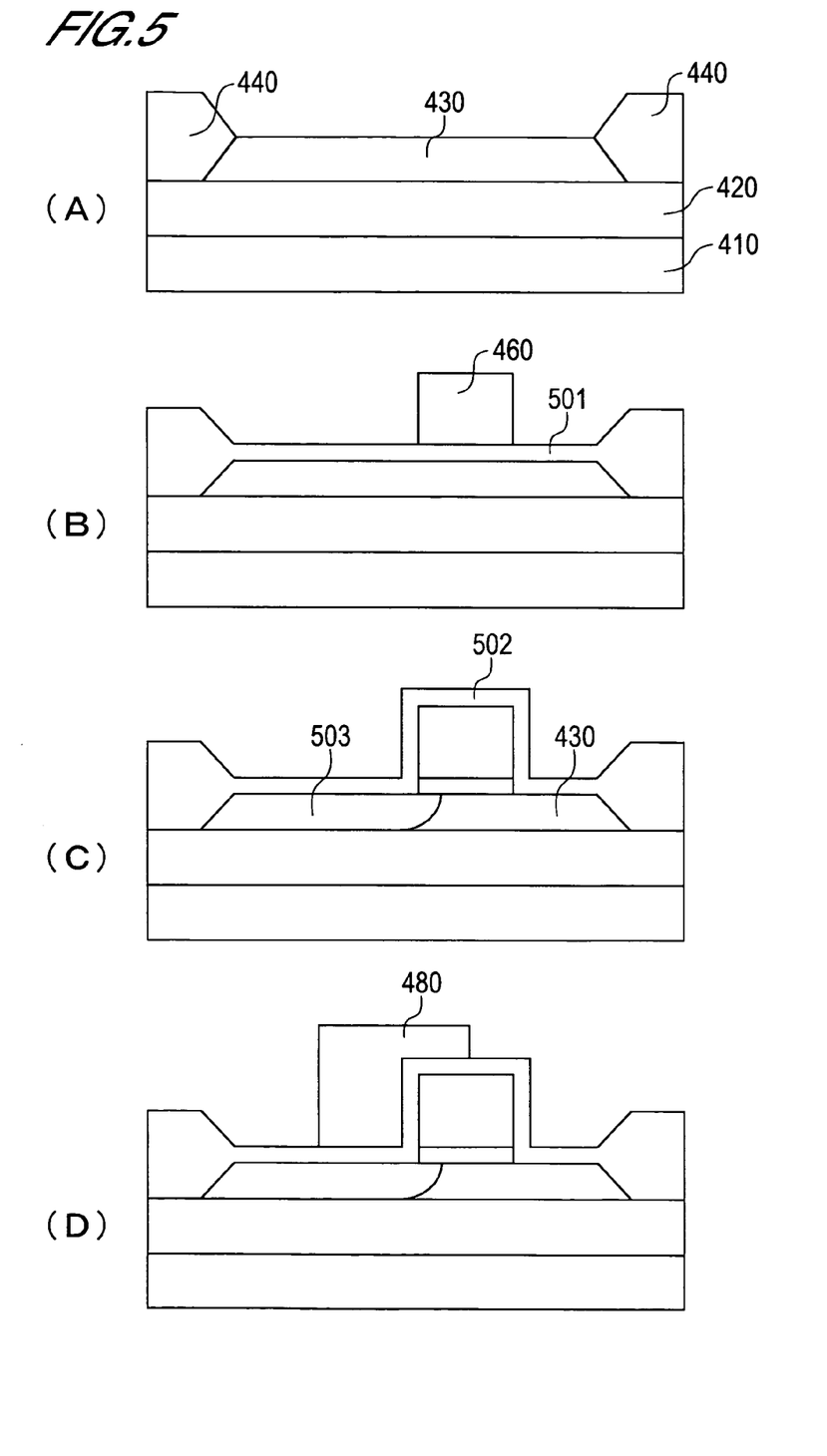
FIG. 5 is cross-sectional process views of a method of fabricating the field effect transistor shown in FIG. 4.

FIG. 4 is a cross-sectional view that schematically shows the constitution of a composite element 400 relating to this embodiment.

As shown in FIG. 4, a p-type semiconductor layer 430 is provided on a substrate 410 via an insulation film 420. An SOI substrate is therefore used in this embodiment.

The element formation region of the p-type semiconductor layer 430 is separated from the element by a field oxide film 440. Further, an intrinsic p-type impurity region 431 ($1 \times 10^{15}$ cm$^{-3}$, for example) and a p-type impurity region 432 ($5 \times 10^{17}$ cm$^{-3}$, for example), which constitute the channel formation region, are formed close to the center of the p-type semiconductor layer 430. In addition, high concentration p-type impurity regions 433 and 434, which constitute source and drain regions, are formed on either side of the regions 431 and 432.

A midgap gate electrode 460 is formed on the surface of the intrinsic p-type impurity region 431 via a gate insulation film 450. Further, an $n^+$ polysilicon gate electrode 480 is formed on the surface of the p-type impurity region 432 via the gate insulation film 450. These gate electrodes 460 and 480 are connected via an insulation film 470.

In the case of the element 400 in FIG. 4, the depression mode nMOS transistor is constituted by the intrinsic p-type impurity region 431, the p-type impurity region 432, the high concentration p-type impurity region 433 and the gap gate electrode 460, and so forth. Here, the intrinsic p-type impurity region 431 is equivalent to a channel formation region, the channel formed in the p-type impurity region 432 is equivalent to a source region, and the high concentration p-type impurity region 433 is equivalent to a drain region.

Further, in the case of the element 400, the enhancement mode nMOS transistor is constituted by the intrinsic p-type impurity region 431, the p-type impurity region 432, the high concentration p-type impurity region 434, and the $n^+$ polysilicon gate electrode 480, and so forth. Here, the p-type impurity region 432 is equivalent to a channel formation region, the channel formed in the intrinsic p-type impurity region 431 is equivalent to a source region, and the high concentration p-type impurity region 434 is equivalent to a drain region.

By applying the same potential to the gate electrodes 460 and 480, the element 400 of FIG. 4 operates in the same manner as the nMOS transistors 120 and 130 (see FIG. 2) of the first embodiment.

Next, an example of a fabrication method for the element 400 shown in FIG. 4 will be described by using the process cross-sectional view in FIG. 5.

First of all, the oxide film 420 of SiO$_2$, for example, is formed by initially oxidizing the SOI substrate 410. Next, a Si$_3$N$_4$ film constituting the semiconductor layer 430 is formed on the surface of the oxide film 420 by using CVD (Chemical Vapor Deposition) or similar, for example. Next, the Si$_3$N$_4$ film in sections other than the element formation region is removed by patterning. Further, by using ion implantation, for example, an impurity is doped to the section from which the $Si_3N_4$ film was removed. Here, the impurity concentration of the $Si_3N_4$ film is set to match the final impurity concentration ($1\times10^{15}$ cm$^{-3}$, for example) of the intrinsic p-type impurity region 432 (see FIG. 4). Thereafter, the field oxide film 440 is formed by selective oxidation or similar (see FIG. 5(A)).

Next, an insulation oxide film 501 is formed on the surface of the semiconductor layer 430 by using thermal oxidation or similar, for example. Then a silicide film such as $TaSi_2$, $TiSi_2$, TaSi, $WSi_2$, or $MoSi_2$, for example, is formed on the surface of the insulation oxide film 501. A deposition technology such as CVD or sputtering, or the like, for example, can be employed for the formation of the silicide film. The temperature during the deposition is 1000° C., for example. Thereafter, the midgap gate electrode 460 is obtained by patterning the silicide film by using selective etching or similar (see FIG. 5(B)).

Next, the exposed parts of the insulation oxide film 501 are removed by using an ordinary etching technology or the like, and re-oxidation is performed by means of thermal oxidation or similar. Accordingly, the exposed face of the semiconductor layer 430 and the surface of the midgap gate electrode 460 are covered by an insulation oxide film 502. As a result, the gate oxide film 450 and the insulation film 470 (see FIG. 4) are formed. Thereafter, by using ion implantation or similar, for example, a p-type impurity is doped to the region where the impurity regions 432 and 434 (see FIG. 4) are formed. As a result, an impurity introduction region 503 is formed (see FIG. 5(C)). The impurity concentration of the impurity introduction region 503 is set to match the final impurity concentration ($5\times10^{17}$ cm$^{-3}$, for example) of the p-type impurity region 434 (see FIG. 4).

Thereafter, a polysilicon layer is formed over the whole surface of the substrate by using CVD at 1200° C., or similar, for example. Then, n$^+$ doping of the polysilicon layer is performed by means of ion implantation or similar. Thereafter, the n$^+$ polysilicon gate electrode 480 is formed by patterning the polysilicon layer by means of selective etching or similar (see FIG. 5(D)).

Finally, ion implantation in the semiconductor layer 430 is performed through self alignment in which the gate electrodes 460 and 480 are employed, whereby the high concentration p-type impurity regions 433 and 434 (see FIG. 4) are formed. In the impurity introduction region 503, the part where the high concentration p-type impurity region 434 is not formed is the p-type impurity region 432. In addition, in the semiconductor layer 430 where the impurity introduction region 503 has not been formed, the part where the high concentration p-type impurity region 433 has not been formed is the intrinsic p-type impurity region 431 (see FIG. 4).

As described hereinabove, the composite element 400 with the structure shown in FIG. 4 is obtained.

A semiconductor integrated circuit (see FIG. 1) that is the same as the first embodiment can also be created in accordance with this embodiment. Therefore, by using the composite element of this embodiment, a semiconductor integrated circuit that is similar to that of the first embodiment, is capable of high speed operation, and exhibits a small leak current when the circuit is not operating can be obtained.

Moreover, similar to that of the first embodiment, a semiconductor integrated circuit in which the surface area of the wiring layer does not increase and with which there is no risk of a withstand voltage drop can be obtained.

In addition, with this embodiment, it is possible to integrate two nMOS transistors and hence achieve greater semiconductor integrated circuit intricacy.

The aspect according to which a p$^+$ polysilicon gate can be adopted in place of the midgap gate electrode 460 is similar to the first embodiment.

What is claimed is:

1. A semiconductor integrated circuit, comprising:
   a first field effect transistor with a first conductivity type enhancement structure that comprises a first conductivity type gate electrode;
   a second field effect transistor with a second conductivity type enhancement structure that comprises a second conductivity type gate electrode;
   a third field effect transistor that has a structure produced by substituting the gate electrode of a field effect transistor having a second conductivity type depression structure for a midgap gate electrode or a first conductivity type gate electrode;
   first wiring that connects a first main electrode of the first field effect transistor and a first main electrode of the second field effect transistor to an output node;
   second wiring that connects the gate electrode of the first, second and third field effect transistors to an input node;
   third wiring that connects a second main electrode of the second field effect transistor and a first main electrode of the third field effect transistor;
   a first power supply line that supplies a first supply voltage to a second main electrode of the first field effect transistor;
   a second power supply line that supplies a second supply voltage to a second main electrode of the third field effect transistor; and
   a third power supply line that supplies a substrate voltage to the second and third field effect transistors.

2. The semiconductor integrated circuit according to claim 1, wherein the third power supply line supplies a first voltage to the substrate of the second and third field effect transistors when the circuit is operating and supplies a second voltage that is lower than the first voltage to the substrate of the second and third field effect transistors when the circuit is not operating.

3. The semiconductor integrated circuit according to claim 2, wherein the first potential is determined such that the operation threshold values of the second and third field effect transistors are substantially the same.

4. The semiconductor integrated circuit according to claim 2, wherein the second voltage is ground potential.

5. The semiconductor integrated circuit according to claim 1, wherein each of the first, second and third field effect transistors comprises: first and second high concentration impurity regions formed so as to be spaced apart on the surface of the semiconductor layer; and a gate electrode that is formed via a gate insulation film on a channel formation region which is a region interposed between the first and second high concentration impurity regions, and
   the enhancement structure and the depression structure are formed by adjusting the impurity concentration of the channel formation region.

6. The semiconductor integrated circuit according to claim 5, wherein the impurity concentration of the channel formation region provided in the third field effect transistor is lower than the impurity concentration of the channel formation region provided in the second field effect transistor.

7. The semiconductor integrated circuit according to claim 6, wherein the impurity concentrations of channel formation regions of the second and third field effect transistors are determined such that the operation threshold values of the second and third field effect transistors are substantially the same when the circuit is orating.

8. A semiconductor integrated circuit, comprising:
a first field effect transistor in which first and second high concentration impurity regions of a first conductivity type are formed such that a second conductivity type channel formation region is interposed therebetween, a first conductivity type gate electrode is formed on the channel formation region via a gate insulation film, and the threshold value voltage is a positive voltage;
a second field effect transistor in which first and second high concentration impurity regions of a second conductivity type are formed such that a first conductivity type channel formation region is interposed therebetween, a second conductivity type gate electrode is formed on the channel formation region via a gate insulation film, and the threshold value voltage is a positive voltage;
a third field effect transistor in which first and second high concentration impurity regions of a second conductivity type are formed such that a first conductivity type channel formation region is interposed therebetween, a gate electrode is formed on the channel formation region via a gate insulation film, the impurity concentration of the channel formation region is set lower than the impurity concentration of the channel formation region provided in the second field effect transistor, and the energy gap of the gate electrode is set at a value at which the threshold value voltage is a positive voltage;
first wiring that connects a first main electrode of the first field effect transistor and a first main electrode of the 10 second field effect transistor to an output node;
second wiring that connects the gate electrode of the first, second and third field effect transistors to an input node;
third wiring that connects a second main electrode of the second field effect transistor and a first main electrode of the third field effect transistor;
a first power supply line that supplies a first supply voltage to a second main electrode of the first field effect transistor;
a second power supply line that supplies a second supply 20 voltage to a second main electrode of the third field effect transistor; and
a third power supply line that supplies a substrate voltage to the second and third field effect transistor.

9. The semiconductor integrated circuit according to claim 8, wherein the third power supply line supplies a first voltage to the substrate of the second and third field effect transistors when the circuit is operating and supplies a second voltage that is lower than the first voltage to the substrate of the second and third field effect transistors when the circuit is not operating.

10. The semiconductor integrated circuit according to claim 9, wherein the first potential is determined such that the operation threshold values of the second and third field effect transistors are substantially the same.

11. The semiconductor integrated circuit according to claim 9, wherein the second voltage is ground potential.

12. The semiconductor integrated circuit according to claim 9, wherein the impurity concentrations of channel formation regions of the second and third field effect transistors are determined such that the operation threshold values of the second and third field effect transistors are substantially the same when the circuit is operating.

13. A semiconductor device having a field effect transistor that comprises:
a first channel formation region of a first conductivity type that has an impurity concentration of a depression structure;
a second channel formation region of a first conductivity type that adjoins the first channel formation region and has an impurity concentration of an enhancement structure;
first and second high concentration impurity regions of a first conductivity type that are formed with the first and second channel formation regions interposed therebetween;
a midgap gate electrode or second conductivity type gate electrode formed on a surface of the first channel formation region via a gate insulation film; and
a first conductivity type gate electrode that is formed on a surface of the second channel formation region via the gate insulation film.

14. The semiconductor device according to claim 13, wherein the impurity concentrations of the first and second channel formation regions are determined such that operation threshold values of channels formed in the first and second channel formation regions when an operating voltage is applied to a semiconductor substrate are substantially equal.

15. A semiconductor device having a field effect transistor circuit that comprises:
a first field effect transistor that has a first conductivity type semiconductor layer with an enhancement structure that comprises a first channel formation region, first and second high concentration impurity regions formed with the first channel formation region interposed therebetween, and a first conductivity type gate electrode that is formed on the surface of the first channel formation region via a first gate insulation film;
a second field effect transistor that has a first conductivity type semiconductor layer with a depression structure that comprises a second channel formation region, third and fourth high concentration impurity regions formed with the second channel formation region interposed therebetween, and a midgap gate electrode or second conductivity type gate electrode that is formed on the surface of the second channel formation region via a second gate insulation film;
wherein an operation threshold voltage of the second field effect transistor is set so as to become equal to an operation threshold voltage of the first field effect transistor when a first substrate bias is supplied to the first and second field effect transistors, and
the operation threshold voltage of the second field effect transistor is set so as to become lower than the operation threshold voltage of the first field effect transistor when a second substrate bias that is higher than the first substrate bias is supplied to the first and second field effect transistors.

16. the semiconductor device according to claim 15, wherein:
the operation threshold voltage of the first field effect transistor is set by adjusting an impurity concentration of the first channel formation region, and
the operation threshold voltage of the second field effect transistor is set by adjusting an impurity concentration of the second channel formation region.

17. the semiconductor device according to claim 15, wherein the first and second field effect transistors are connected in series.

18. the semiconductor device according to claim 15, wherein a same gate voltage is applied to the gate electrode of the first field effect transistor and to the gate electrode of the second field effect transistor.

* * * * *